US012709083B2

(12) United States Patent
Nakazawa et al.

(10) Patent No.: US 12,709,083 B2
(45) Date of Patent: Aug. 18, 2026

(54) ADHESIVE FILM FOR CIRCUIT CONNECTION, AND CIRCUIT CONNECTION STRUCTURE AND MANUFACTURING METHOD THEREFOR

(71) Applicant: Showa Denko Materials Co., Ltd., Tokyo (JP)

(72) Inventors: Takashi Nakazawa, Tokyo (JP); Hiroyuki Sakai, Tokyo (JP); Masato Fukui, Tokyo (JP); Kazuya Naritomi, Tokyo (JP); Tomoharu Yamazaki, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 542 days.

(21) Appl. No.: 17/926,362

(22) PCT Filed: Jun. 8, 2021

(86) PCT No.: PCT/JP2021/021760

§ 371 (c)(1),
(2) Date: Mar. 28, 2023

(87) PCT Pub. No.: WO2021/251386

PCT Pub. Date: Dec. 16, 2021

(65) Prior Publication Data

US 2023/0234333 A1 Jul. 27, 2023

(30) Foreign Application Priority Data

Jun. 11, 2020 (JP) ................................ 2020-101756

(51) Int. Cl.
*B32B 7/12* (2006.01)
*B32B 27/18* (2006.01)
(Continued)

(52) U.S. Cl.
CPC ................ *B32B 7/12* (2013.01); *B32B 27/18* (2013.01); *C09J 7/38* (2018.01); *C09J 9/02* (2013.01); *H05K 1/09* (2013.01); *H05K 3/20* (2013.01); *B32B 27/28* (2013.01); *B32B 27/281* (2013.01); *B32B 27/36* (2013.01);
(Continued)

(58) Field of Classification Search
None
See application file for complete search history.

(56) References Cited

FOREIGN PATENT DOCUMENTS

CN 104508064 A 4/2015
CN 111052881 A 4/2020
(Continued)

OTHER PUBLICATIONS

English translation of WO 2018/181536 (Year: 2018).*
Machine translation of JP2017-214472 (Year: 2025).*

*Primary Examiner* — Samir Shah
(74) *Attorney, Agent, or Firm* — FITCH, EVEN, TABIN & FLANNERY, LLP

(57) ABSTRACT

Disclosed is an adhesive film for circuit connection. This adhesive film for circuit connection includes a first adhesive layer containing conductive particles, a cured product of a photocurable resin component, and a first thermosetting resin component, and a second adhesive layer provided on the first adhesive layer and containing a second thermosetting resin component. A thickness of the first adhesive layer is 5 μm or less.

7 Claims, 3 Drawing Sheets

(51) Int. Cl.

| | |
|---|---|
| ***C09J 7/38*** | (2018.01) |
| ***C09J 9/02*** | (2006.01) |
| ***H05K 1/09*** | (2006.01) |
| ***H05K 3/20*** | (2006.01) |
| *B32B 27/28* | (2006.01) |
| *B32B 27/36* | (2006.01) |

(52) U.S. Cl.

CPC ... *B32B 2264/303* (2020.08); *B32B 2264/403* (2020.08); *B32B 2307/7376* (2023.05); *B32B 2457/08* (2013.01)

(56) References Cited

FOREIGN PATENT DOCUMENTS

| | | | | | |
|---|---|---|---|---|---|
| JP | 2016-054288 | A | | 4/2016 | |
| JP | 2017214472 | A | * | 12/2017 | |
| WO | WO-2018181536 | A1 | * | 10/2018 | ........... C08K 5/5415 |
| WO | 2019/050006 | A1 | | 3/2019 | |
| WO | 2020/022485 | A1 | | 1/2020 | |

* cited by examiner (a)

(b)

ADHESIVE FILM FOR CIRCUIT CONNECTION, AND CIRCUIT CONNECTION STRUCTURE AND MANUFACTURING METHOD THEREFOR

CROSS-REFERENCE TO RELATED APPLICATIONS

This application is a U.S. national phase application filed under 35 U.S.C. § 371 of International Application No PCT/JP2021/021760, filed Jun. 8, 2021, designating the United States, which claims priority from Japanese application No. 2020-101756, filed Jun. 11 21, 2020, which is incorporated herein by reference in its entirety.

TECHNICAL FIELD

The present disclosure relates to an adhesive film for circuit connection, and a circuit connection structure and a manufacturing method therefor.

BACKGROUND ART

Conventionally, a liquid crystal display panel, an organic EL panel, and the like have been used as various display means such as televisions, PC monitors, cellular phones, and smartphones. In such display apparatuses, there have been employed what is called COG (chip on glass) mounting, the direct mounting of an IC for driving on a glass substrate of a display panel, from the viewpoint of finer pitches, weight reduction, and the like.

In a liquid crystal display panel into which the COG mounting method is adopted, for example, a semiconductor element such as an IC for liquid crystal driving is connected onto a transparent substrate (such as a glass substrate) having a plurality of transparent electrodes (such as ITO (indium tin oxide)). As an adhesive material for connecting an electrode terminal of a semiconductor element and a transparent electrode to each other, an adhesive film for circuit connection having anisotropic conductivity in which conductive particles are dispersed in an adhesive has been used. For example, in a case where an IC for liquid crystal driving is mounted as a semiconductor element, the IC for liquid crystal driving has a plurality of electrode terminals corresponding to transparent electrodes on the mounting surface thereof, and the IC for liquid crystal driving is thermocompression bonded onto a transparent substrate through the adhesive film for circuit connection having anisotropic conductivity to connect the electrode terminals and the transparent electrodes to each other, so that a circuit connection structure can be obtained.

In recent years, a display having a curved surface (flexible display) has been proposed. In such a flexible display, since a plastic substrate (such as a polyimide substrate) having flexibility is used as a substrate instead of a glass substrate, various electronic components such as an IC for driving are also mounted on the plastic substrate. As such a mounting method, COP (chip on plastic) mounting using an adhesive film for circuit connection having anisotropic conductivity has been studied (see, for example, Patent Literature 1).

CITATION LIST

Patent Literature

Patent Literature 1: JP 2016-054288 A

SUMMARY OF INVENTION

Technical Problem

However, in a flexible display used in an organic EL panel or the like, a polyimide substrate that has a circuit electrode having a titanium layer on the outermost layer thereof is used. According to studies of the present inventors, it has been found that the circuit electrode having a titanium layer on the outermost layer thereof has an oxide coating film on the surface thereof, and the connection resistance between circuits is likely to be reduced as the resin fluidity of the adhesive film for circuit connection increases. However, high resin fluidity means that the conductive particles are also easy to flow at the same time, and short circuit failure between circuits adjacent to each other is likely to occur due to the flowing conductive particles.

On the other hand, for example, it has been studied that the fluidity of the conductive particles is suppressed by curing the adhesive of the adhesive film for circuit connection by heat or light. However, in this case, it is speculated that the exclusion property of the resin in the adhesive is also decreased, and thus the connection resistance is increased.

The exclusion property of the resin itself can be tolerant in principle by mounting at a high pressure. However, at this time, a pressure-sensitive adhesive layer such as a pressure-sensitive resin and a film such as PET (polyethylene terephthalate) or PEN (polyethylene naphthalate) are usually disposed on the lower surface of the polyimide substrate, a stress is accumulated in the circuit electrode having a titanium layer on the outermost layer thereof as well as the polyimide substrate to cause cracks, and thus a failure such as disconnection of a circuit may occur. Therefore, in the mounting of the flexible display, mounting is desirably performed at a low pressure (for example, a pressure of 0.1 to 50 MPa in terms of area in a bump electrode), and suppression of the fluidity of conductive particles and suppression of an increase in connection resistance in low-pressure mounting are required in the adhesive film for circuit connection to be used for COP mounting.

In this regard, a main object of the present disclosure is to provide an adhesive film for circuit connection capable of improving the capture rate of the conductive particles between electrodes facing each other of a circuit connection structure, and reducing the connection resistance even in the case of mounting at a low pressure.

Solution to Problem

An aspect of the present disclosure relates to an adhesive film for circuit connection. This adhesive film for circuit connection includes a first adhesive layer containing conductive particles, a cured product of a photocurable resin component, and a first thermosetting resin component, and a second adhesive layer provided on the first adhesive layer and containing a second thermosetting resin component. A thickness of the first adhesive layer is 5 μm or less. According to such an adhesive film for circuit connection, a decrease in exclusion property of the resin can be suppressed while the fluidity of the conductive particles at the time of circuit connection is suppressed by curing the photocurable resin component. Furthermore, when the thickness of the first adhesive layer is 5 μm or less, the fluidity of the conductive particles at the time of circuit connection can be further suppressed. Therefore, the capture rate of the conductive particles between electrodes facing each other of a circuit connection structure can be improved, and the connection resistance can be reduced even in the case of mounting at a low pressure. Such an adhesive film for circuit connection can be suitably used for COP mounting.

The first thermosetting resin component and the second thermosetting resin component may contain a cationic polymerizable compound and a thermal cationic polymerization initiator, and the photocurable resin component may contain a radical polymerizable compound. At this time, the first thermosetting resin component and the second thermosetting resin component have cationic curability, and the photocurable resin component has radical curability. According to studies of the present inventors, when the first thermosetting resin component, the second thermosetting resin component, and the photocurable resin component are such a combination, for example, as compared to a case where all the curable resin components have cationic curability, there is a tendency that connection resistance is more excellent. The inventors of the present disclosure speculate the reasons why such an effect is exhibited as follows. That is, the reasons are considered that when all the curable resin components have a cationic curable component, for example, in the first adhesive layer, there is a case where a cationic active species remains when a cured product of the photocurable resin component is formed, the curing reaction of the second thermosetting resin component in the second adhesive layer proceeds by this cationic active species, and thus the exclusion property of the resin is decreased. Therefore, when the photocurable resin component has radical curability, since a cationic active species is not generated when a cured product of the photocurable resin component is formed, proceeding of the curing reaction of the second thermosetting resin component in the second adhesive layer can be suppressed, and a decrease in exclusion property of the resin is suppressed, so that the connection resistance is expected to be reduced.

The cationic polymerizable compound may be at least one selected from the group consisting of an oxetane compound and an alicyclic epoxy compound. The thermal cationic polymerization initiator may be a salt compound that has an anion containing boron as a constituent element.

The adhesive film for circuit connection may further include a third adhesive layer provided on the first adhesive layer on a side opposite to the second adhesive layer and containing a third thermosetting resin component. The third thermosetting resin component may contain a cationic polymerizable compound and a thermal cationic polymerization initiator.

Another aspect of the present disclosure relates to a method for manufacturing a circuit connection structure. This method for manufacturing a circuit connection structure includes interposing the above-described adhesive film for circuit connection between a first circuit member having a first electrode and a second circuit member having a second electrode and thermocompression bonding the first circuit member and the second circuit member to electrically connect the first electrode and the second electrode to each other.

Still another aspect of the present disclosure relates to a circuit connection structure. This circuit connection structure includes a first circuit member having a first electrode, a second circuit member having a second electrode, and a circuit connection portion disposed between the first circuit member and the second circuit member and electrically connecting the first electrode and the second electrode to each other. The circuit connection portion contains a cured product of the above-described adhesive film for circuit connection.

Advantageous Effects of Invention

According to the present disclosure, there is disclosed an adhesive film for circuit connection capable of improving the capture rate of the conductive particles between electrodes facing each other of a circuit connection structure, and reducing the connection resistance even in the case of mounting at a low pressure. Such an adhesive film for circuit connection can be suitably used for COP mounting. Furthermore, according to the present disclosure, there are disclosed a circuit connection structure and a manufacturing method therefor which use such an adhesive film for circuit connection.

BRIEF DESCRIPTION OF DRAWINGS

FIG. 3(*a*) and FIG. 3(*b*) are schematic cross-sectional views illustrating respective steps.

DESCRIPTION OF EMBODIMENTS

Hereinafter, embodiments of the present disclosure will be described in detail with reference to the drawings. In the following description, similar or corresponding portions will be designated with similar signs, and redundant description will be omitted. Note that, the present disclosure is not limited to the following embodiments.

In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage may be replaced with the upper limit value or the lower limit value of the numerical range of another stage. Furthermore, in a numerical range described in the present specification, the upper limit value or the lower limit value of the numerical range may be replaced with a value shown in the Examples. Furthermore, any combinations of upper limit values and lower limit values separately described are possible. In the notation of the numerical range "A to B", the numerical values A and B are included in the numerical range as the lower limit value and the upper limit value, respectively. In the present specification, for example, the description "10 or more" means "10" and "numerical values more than 10", and the same applies to the case of different numerical values. Furthermore, for example, the description "10 or less" means "10" and "numerical values less than 10", and the same applies to the case of different numerical values. Furthermore, in the present specification, the term "(meth)acrylate" means at least one of acrylate and methacrylate corresponding thereto. The same applies to other analogous expressions such as "(meth)acryloyl", "(meth)acrylic acid", and the like. Furthermore, "A or B" may include either one of A and B, and may also include both of A and B. Furthermore, materials listed as examples below may be used singly or in combinations of two or more kinds thereof, unless otherwise specified. When a plurality of substances corresponding to each component exist in the composition, the content of each component in the composition means the total amount of the plurality of substances that exist in the composition, unless otherwise specified.

[Adhesive Film for Circuit Connection]

Figure 1:
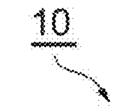
FIG. 1 is a schematic cross-sectional view illustrating an embodiment of an adhesive film for circuit connection.
Figure 1:
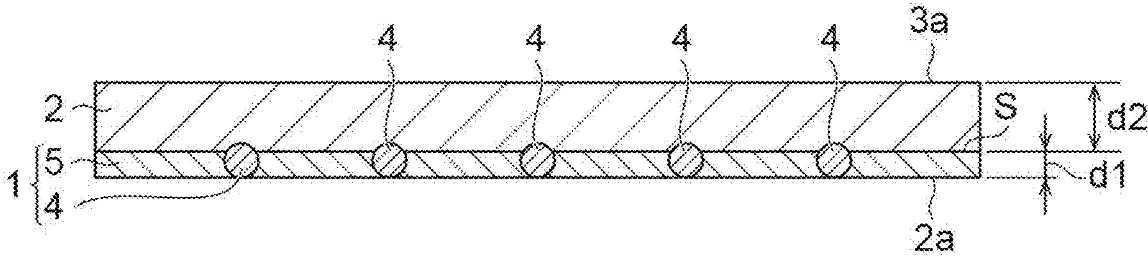

FIG. 1 is a schematic cross-sectional view illustrating an embodiment of an adhesive film for circuit connection. An adhesive film for circuit connection 10 illustrated in FIG. 1 (hereinafter, simply referred to as "adhesive film 10" in some cases) includes a first adhesive layer 1 containing conductive particles 4 and an adhesive component 5 including a cured product of a photocurable resin component and a (first) thermosetting resin component, and a second adhesive layer 2 provided on the first adhesive layer 1 and containing a (second) thermosetting resin component. In the adhesive film 10, there may be a first region that is a region formed from a first adhesive film (first adhesive layer 1) and a second region that is a region provided adjacent to the first region and formed from a second adhesive film (second adhesive layer 2). That is, it is also conceivable that the adhesive film 10 includes the first region containing the conductive particles 4 and the adhesive component 5 including a cured product of a photocurable resin component and a (first) thermosetting resin component, and the second region provided adjacent to the first region and containing a (second) thermosetting resin component.

In the adhesive film 10, the conductive particles 4 are dispersed in the first adhesive layer 1. Therefore, the adhesive film 10 may be an adhesive film for circuit connection having anisotropic conductivity (anisotropic conductive adhesive film). The adhesive film 10 may be interposed between a first circuit member having a first electrode and a second circuit member having a second electrode and used for electrically connecting the first electrode and the second electrode to each other by thermocompression bonding the first circuit member and the second circuit member.

<First Adhesive Layer>

The first adhesive layer 1 contains the conductive particles 4 (hereinafter, referred to as "component (A)" in some cases), a cured product of the photocurable resin component (hereinafter, referred to as "component (B)" in some cases), and the thermosetting resin component (hereinafter, referred to as "component (C)" in some cases). The first adhesive layer 1 can be obtained, for example, by irradiating a composition layer composed of a composition containing the component (A), the component (B), and the component (C) with light energy to polymerize the component contained in the component (B), and curing the component (B). The first adhesive layer 1 contains the component (A) and the adhesive component 5 including a cured product of the component (B) and the component (C). The cured product of the component (B) may be a cured product obtained by completely curing the component (B), and may be a cured product obtained by partially curing the component (B). The component (C) is a component that can flow at the time of circuit connection, and is, for example, an uncured curable resin component.

Component (A): Conductive Particles

The component (A) is not particularly limited as long as it is particles having conductivity, and may be metal particles configured by metals such as Au, Ag, Pd, Ni, Cu, and solder, conductive carbon particles configured by conductive carbon, or the like. The component (A) may be coated conductive particles each including a core which includes non-conductive glass, ceramic, plastic (such as polystyrene), or the like, and a coating layer which includes the metal or the conductive carbon described above and covers the core. Among these, the component (A) is preferably coated conductive particles each including a core which includes metal particle formed from a hot-melt metal or plastic, and a coating layer which includes the metal or the conductive carbon and covers the core. Since a cured product of the thermosetting resin component is easily deformed by heating or pressurizing, such coated conductive particles can increase the contact area between the electrodes and the component (A) and further improve the conductivity between the electrodes when the electrodes are electrically connected to each other.

The component (A) may be insulating coated conductive particles each including the metal particles, the conductive carbon particles, or the coated conductive particles described above and an insulating material such as a resin and provided with an insulating layer which covers the surface of the particles. When the component (A) is insulating coated conductive particles, even in a case where the content of the component (A) is large, since the insulating layer is provided on the surface of the particles, occurrence of short circuit due to contact between the components (A) can be suppressed, and insulation properties between electrode circuits adjacent to each other can also be improved. As the component (A), one kind of the various conductive particles described above is used singly or two or more kinds thereof are used in combination.

It is necessary that the maximum particle diameter of the component (A) is smaller than the minimum interval between electrodes (the shortest distance between electrodes adjacent to each other). The maximum particle diameter of the component (A) may be 1.0 μm or more, 2.0 μm or more, or 2.5 μm or more, from the viewpoint of excellent dispersibility and conductivity. The maximum particle diameter of the component (A) may be 20 μm or less, 10 μm or less, or 5 μm or less, from the viewpoint of excellent dispersibility and conductivity. In the present specification, the particle diameters of arbitrary 300 (pcs) conductive particles are measured by observation using a scanning electron microscope (SEM), and the largest value thus obtained is regarded as the maximum particle diameter of the component (A). Note that, in a case where the component (A) does not have a spherical shape, for example, the component (A) has a projection, the particle diameter of the component (A) is a diameter of a circle circumscribing the conductive particle in an SEM image.

The average particle diameter of the component (A) may be 1.0 μm or more, 2.0 μm or more, or 2.5 μm or more, from the viewpoint of excellent dispersibility and conductivity. The average particle diameter of the component (A) may be 20 μm or less, 10 μm or less, or 5 μm or less, from the viewpoint of excellent dispersibility and conductivity. In the present specification, the particle diameters of arbitrary 300 (pcs) conductive particles are measured by observation using a scanning electron microscope (SEM), and the average value of particle diameters thus obtained is regarded as the average particle diameter.

In the first adhesive layer 1, it is preferable that the component (A) is uniformly dispersed. The particle density of the component (A) in the adhesive film 10 may be 100 counts/$mm^2$ or more, 1000 counts/$mm^2$ or more, 3000 counts/$mm^2$ or more, or 5000 counts/$mm^2$ or more, from the viewpoint of obtaining stable connection resistance. The particle density of the component (A) in the adhesive film 10 may be 100000 counts/$mm^2$ or less, 70000 counts/$mm^2$ or less, 50000 counts/$mm^2$ or less, or 30000 counts/$mm^2$ or less, from the viewpoint of improving insulation properties between electrodes adjacent to each other.

The content of the component (A) may be 1% by mass or more, 5% by mass or more, or 10% by mass or more, on the basis of the total mass of the first adhesive layer, from the viewpoint that conductivity can be further improved. The content of the component (A) may be 60% by mass or less, 50% by mass or less, or 40% by mass or less, on the basis of the total mass of the first adhesive layer, from the viewpoint of easily suppressing short circuit. When the content of the component (A) is in the above range, the effect of the present disclosure tends to be significantly exhibited. Note that, the content of the component (A) in the composition or the composition layer (on the basis of the total mass of the composition or the composition layer) may be the same as the above range.

Component (B): Photocurable Resin Component

The component (B) is not particularly limited as long as it is a resin component that is cured by light irradiation, but in a case where the component (C) is a resin component having cationic curability, the component (B) may be a resin component having radical curability from the viewpoint of more excellent connection resistance. The component (B) may include, for example, a radical polymerizable compound (hereinafter, referred to as "component (B1)" in some cases) and a photo radical polymerization initiator (hereinafter, referred to as "component (B2)" in some cases). The component (B) may be a component composed of the component (B1) and the component (B2).

Component (B1): Radical Polymerizable Compound

The component (B1) is a compound that is polymerized by radicals generated from the component (B2) by irradiation of light (for example, ultraviolet light). The component (B1) may be either a monomer or a polymer (or an oligomer) obtained by polymerizing one or two or more kinds of monomers. The component (B1) may be used singly or may be used in combination of two or more thereof.

The component (B1) is a compound having a radical polymerizable group that reacts by radicals. Examples of the radical polymerizable group include a (meth)acryloyl group, a vinyl group, an allyl group, a styryl group, an alkenyl group, an alkenylene group, and a maleimide group. The number of radical polymerizable groups (the number of functional groups) that the component (B1) has may be 2 or more from the viewpoint of easily obtaining a desired melt viscosity, further improving the effect of reducing connection resistance, and having more excellent connection reliability after polymerization, and may be 10 or less from the viewpoint of suppressing shrinkage on curing at the time of polymerization. Furthermore, in order to achieve the crosslinking density and the shrinkage on curing in a well-balanced manner, a compound in which the number of radical polymerizable groups is out of the above range may be used in addition to a compound in which the number of radical polymerizable groups is within the above range.

The component (B1) may include, for example, a polyfunctional (bifunctional or higher-functional) (meth) acrylate from the viewpoint of suppressing the flowing of the conductive particles. The polyfunctional (bifunctional or higher-functional) (meth)acrylate may be a bifunctional (meth)acrylate, and the bifunctional (meth)acrylate may be a bifunctional aromatic (meth)acrylate.

Examples of the polyfunctional (meth)acrylate include aliphatic (meth)acrylates such as ethylene glycol di(meth) acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, tetrapropylene glycol di(meth)acrylate, polypropylene glycol di(meth)acrylate, ethoxylated polypropylene glycol di(meth)acrylate, 1,3-butanediol di(meth)acrylate, 1,4-butanediol di(meth)acrylate, neopentyl glycol di(meth)acrylate, 3-methyl-1,5-pentanediol di(meth)acrylate, 1,6-hexanediol di(meth)acrylate, 2-butyl-2-ethyl-1,3-propanediol di(meth)acrylate, 1,9-nonanediol di(meth)acrylate, 1,10-decanediol di(meth)acrylate, glycerin di(meth)acrylate, tricyclodecanedimethanol (meth)acrylate, and ethoxylated 2-methyl-1,3-propanediol di(meth)acrylate; aromatic (meth)acrylates such as ethoxylated bisphenol A type di(meth)acrylate, propoxylated bisphenol A type di(meth)acrylate, ethoxylated propoxylated bisphenol A type di(meth)acrylate, ethoxylated bisphenol F type di(meth)acrylate, propoxylated bisphenol F type di(meth)acrylate, ethoxylated propoxylated bisphenol F type di(meth)acrylate, ethoxylated fluorene type di(meth)acrylate, propoxylated fluorene type di(meth)acrylate, and ethoxylated propoxylated fluorene type di(meth)acrylate; aliphatic (meth)acrylates such as trimethylol propane tri (meth)acrylate, ethoxylated trimethylol propane tri(meth) acrylate, propoxylated trimethylol propane tri(meth)acrylate, ethoxylated propoxylated trimethylol propane tri(meth) acrylate, pentaerythritol tri(meth)acrylate, ethoxylated pentaerythritol tri(meth)acrylate, propoxylated pentaerythritol tri(meth)acrylate, ethoxylated propoxylated pentaerythritol tri(meth)acrylate, pentaerythritol tetra(meth)acrylate, ethoxylated pentaerythritol tetra(meth)acrylate, propoxylated pentaerythritol tetra(meth)acrylate, ethoxylated propoxylated pentaerythritol tetra(meth)acrylate, ditrimethylol propane tetraacrylate, and dipentaerythritol hexa(meth) acrylate; and aromatic epoxy (meth)acrylates such as bisphenol type epoxy (meth)acrylate, phenol novolac type epoxy (meth)acrylate, and cresol novolac type epoxy (meth) acrylate.

The content of the polyfunctional (bifunctional or higher-functional) (meth)acrylate may be, for example, 40 to 100% by mass, 50 to 100% by mass, or 60 to 100% by mass, on the basis of the total mass of the component (B1), from the viewpoint of achieving both of the effect of reducing connection resistance and suppression of the flowing of particles.

The component (B1) may further include a monofunctional (meth)acrylate in addition to the polyfunctional (bifunctional or higher-functional) (meth)acrylate. Examples of the monofunctional (meth)acrylate include (meth)acrylic acid; aliphatic (meth)acrylates such as methyl (meth)acrylate, ethyl (meth)acrylate, butyl (meth)acrylate, isobutyl (meth)acrylate, tert-butyl (meth)acrylate, butoxyethyl (meth)acrylate, isoamyl (meth)acrylate, hexyl (meth)acrylate, 2-ethylhexyl (meth)acrylate, heptyl (meth)acrylate, octylheptyl (meth)acrylate, nonyl (meth)acrylate, decyl (meth)acrylate, 2-hydroxyethyl (meth)acrylate, 2-hydroxypropyl (meth)acrylate, 3-chloro-2-hydroxypropyl (meth) acrylate, 2-hydroxybutyl (meth)acrylate, methoxypolyethylene glycol (meth)acrylate, ethoxypolyethylene glycol (meth)acrylate, methoxypolypropylene glycol (meth)acrylate, ethoxypolypropylene glycol (meth)acrylate, and mono (2-(meth)acryloyloxyethyl)succinate; aromatic (meth)acrylates such as benzyl (meth)acrylate, phenyl (meth)acrylate, o-biphenyl (meth)acrylate, 1-naphthyl (meth)acrylate, 2-naphthyl (meth)acrylate, phenoxyethyl (meth)acrylate, p-cumylphenoxyethyl (meth)acrylate, o-phenylphenoxyethyl (meth)acrylate, 1-naphthoxyethyl (meth)acrylate, 2-naphthoxyethyl (meth)acrylate, phenoxypolyethylene glycol (meth)acrylate, nonylphenoxypolyethylene glycol (meth)acrylate, phenoxypolypropylene glycol (meth)acrylate, 2-hydroxy-3-phenoxypropyl (meth)acrylate, 2-hydroxy-3-(o-phenylphenoxy)propyl (meth)acrylate, 2-hydroxy-3-(1-naphthoxy)propyl (meth)acrylate, and 2-hydroxy-3-(2-naphthoxy)propyl (meth)acrylate; (meth) acrylates having an epoxy group such as glycidyl (meth) acrylate, (meth)acrylates having an alicyclic epoxy group such as 3,4-epoxycyclohexylmethyl (meth)acrylate, and (meth)acrylates having an oxetanyl group such as (3-ethyl-oxetane-3-yl)methyl (meth)acrylate.

The content of the monofunctional (meth)acrylate may be, for example, 0 to 60% by mass, 0 to 50% by mass, or 0 to 40% by mass, on the basis of the total mass of the component (B1).

The cured product of the component (B) may have, for example, a polymerizable group that reacts by those other than radicals. The polymerizable group that reacts by those other than radicals may be, for example, a cationic polymerizable group that reacts by cations. Examples of the cationic polymerizable group include epoxy groups such as a glycidyl group, alicyclic epoxy groups such as an epoxycyclohexylmethyl group, and oxetanyl groups such as ethyloxetanylmethyl group. The cured product of the component (B) having a polymerizable group that reacts by those other than radicals can be introduced, for example, by using, as the component (B), a (meth)acrylate having a polymerizable group that reacts by those other than radicals such as a (meth)acrylate having an epoxy group, a (meth)acrylate having an alicyclic epoxy group, and a (meth)acrylate having an oxetanyl group. The mass ratio of the (meth)acrylate having a polymerizable group that reacts by those other than radicals with respect to the total mass of the component (B1) (the mass (charged amount) of the (meth)acrylate having a polymerizable group that reacts by those other than radicals/ the total mass (charged amount) of the component (B1)) may be, for example, 0 to 0.7, 0 to 0.5, or 0 to 0.3, from the viewpoint of improving reliability.

The component (B1) may include other radical polymerizable compounds in addition to the polyfunctional (bifunctional or higher-functional) and monofunctional (meth)acrylates. Examples of the other radical polymerizable compounds include a maleimide compound, a vinyl ether compound, an allyl compound, a styrene derivative, an acrylamide derivative, and a nadimide derivative. The content of the other radical polymerizable compounds may be, for example, 0 to 40% by mass on the basis of the total mass of the component (B1).

Component (B2): Photo Radical Polymerization Initiator

The component (B2) is a photopolymerization initiator that generates radicals by irradiation of light including a wavelength within a range of 150 to 750 nm, preferably light including a wavelength within a range of 254 to 405 nm, and further preferably light including a wavelength of 365 nm (for example, ultraviolet light). The component (B2) may be used singly or may be used in combination of two or more thereof.

The component (B2) is decomposed by light to generate free radicals. That is, the component (B2) is a compound that generates radicals by impartment of light energy from the outside. The component (B2) may be a compound having a structure such as an oxime ester structure, a bisimidazole structure, an acridine structure, an α-aminoalkyl phenone structure, an aminobenzophenone structure, an N-phenylglycine structure, an acylphosphine oxide structure, a benzyl dimethylketal structure, or an α-hydroxyalkyl phenone structure. The component (B2) may be used singly or may be used in combination of two or more thereof. The component (B2) may be a compound having at least one structure selected from the group consisting of an oxime ester structure, an α-aminoalkyl phenone structure, and an acylphosphine oxide structure, from the viewpoint of easily obtaining a desired melt viscosity and the viewpoint of a more excellent effect of reducing connection resistance.

Specific examples of the compound having an oxime ester structure include 1-phenyl-1,2-butanedione-2-(o-methoxycarbonyl)oxime, 1-phenyl-1,2-propanedione-2-(o-methoxycarbonyl)oxime, 1-phenyl-1,2-propanedione-2-(o-ethoxycarbonyl)oxime, 1-phenyl-1,2-propanedione-2-o-benzoyloxime, 1,3-diphenylpropanetrione-2-(o-ethoxycarbonyl)oxime, 1-phenyl-3-ethoxypropanetrione-2-(o-benzoyl)oxime, 1,2-octanedione,1-[4-(phenylthio) phenyl-,2-(o-benzoyloxime)], and ethanone,1-[9-ethyl-6-(2-methylbenzoyl)-9H-carbazol-3-yl]-,1-(o-acetyloxime).

Specific examples of the compound having an α-aminoalkyl phenone structure include 2-methyl-1-[4-(methylthio) phenyl]-2-morpholinopropan-1-one and 2-benzyl-2-dimethylamino-1-(morpholinophenyl)-butan-1.

Specific examples of the compound having an acylphosphine oxide structure include bis(2,6-dimethoxybenzoyl)-2,4,4-trimethyl-pentylphosphine oxide, bis(2,4,6,-trimethylbenzoyl)-phenylphosphine oxide, and 2,4,6-trimethylbenzoyl-diphenylphosphine oxide.

The content of the component (B2) may be, for example, 0.1 to 10 parts by mass, 0.3 to 7 parts by mass, or 0.5 to 5 parts by mass, with respect to 100 parts by mass of the component (B1), from the viewpoint of suppressing the flowing of the conductive particles.

The content of the cured product of the component (B) may be 1% by mass or more, 5% by mass or more, or 10% by mass or more, on the basis of the total mass of the first adhesive layer, from the viewpoint of suppressing the flowing of the conductive particles. The content of the cured product of the component (B) may be 50% by mass or less, 40% by mass or less, or 30% by mass or less, on the basis of the total mass of the first adhesive layer, from the viewpoint of expressing low resistance in low-pressure mounting. When the content of the cured product of the component (B) is in the above range, the effect of the present disclosure tends to be significantly exhibited. Note that, the content of the component (B) in the composition or the composition layer (on the basis of the total mass of the composition or the composition layer) may be the same as the above range.

Component (C): Thermosetting Resin Component

The component (C) is not particularly limited as long as it is a resin component that is cured by heat, but in a case where the component (B) is a resin component having radical curability, the component (C) may be a resin component having cationic curability from the viewpoint of more excellent connection resistance. The component (C) may include, for example, a cationic polymerizable compound (hereinafter, referred to as "component (C1)" in some cases) and a thermal cationic polymerization initiator (hereinafter, referred to as "component (C2)" in some cases). The component (C) may be a component composed of the component (C1) and the component (C2). Note that, each of the first thermosetting resin component, the second thermosetting resin component, and the third thermosetting resin component means a thermosetting resin component contained in each of the first adhesive layer, the second adhesive layer, and the third adhesive layer, and the components (for example, the component (C1), the component (C2), and the like) contained in the first thermosetting resin component, the second thermosetting resin component, and the third thermosetting resin component and the contents thereof may be the same as or different from each other.

Component (C1): Cationic Polymerizable Compound

The component (C1) is a compound that is cross-linked by reaction with the component (C2) by heat. Note that, the component (C1) means a compound not having a radical polymerizable group that reacts by radicals, and the component (C1) is not included in the component (B1). The component (C1) may be, for example, at least one selected from the group consisting of an oxetane compound and an alicyclic epoxy compound from the viewpoint of further improving the effect of reducing connection resistance and having more excellent connection reliability. The component (C1) may be used singly or may be used in combination of two or more thereof. The component (C1) preferably includes both of at least one kind of oxetane compounds and at least one kind of alicyclic epoxy compounds, from the viewpoint of easily obtaining a desired melt viscosity.

The oxetane compound as the component (C1) can be used without particular limitation as long as it is a compound having an oxetanyl group and not having a radical polymerizable group. Examples of commercially available products of the oxetane compound include ETERNACOLL OXBP (trade name, 4,4'-bis[(3-ethyl oxetanyl)methoxymethyl]biphenyl, manufactured by UBE Corporation), and OXSQ, OXT-121, OXT-221, OXT-101, and OXT-212 (trade name, manufactured by TOAGOSEI CO., LTD.). One kind of these compounds may be used singly or these compounds may be used in combination of two or more thereof.

The alicyclic epoxy compound as the component (C1) can be used without particular limitation as long as it is a compound having an alicyclic epoxy group (for example, an epoxycyclohexyl group) and not having a radical polymerizable group. Examples of commercially available products of the alicyclic epoxy compound include EHPE3150, EHPE3150CE, CELLOXIDE 8010, CELLOXIDE 2021P, and CELLOXIDE 2081 (trade name, manufactured by Daicel Corporation). One kind of these compounds may be used singly or these compounds may be used in combination of two or more thereof.

Component (C2): Thermal Cationic Polymerization Initiator

The component (C2) is a thermal polymerization initiator that generates an acid or the like by heating to start polymerization. The component (C2) may be a salt compound configured by a cation and an anion. Examples of the component (C2) include onium salts, such as a sulfonium salt, a phosphonium salt, an ammonium salt, a diazonium salt, an iodonium salt, and an anilinium salt, having anions such as $BF_4^-$, $BR_4^-$ (R represents a phenyl group substituted with two or more fluorine atoms or two or more trifluoromethyl groups), $PF_6^-$, $SbF_6^-$, and $AsF_6^-$. These may be used singly or may be used in combination of two or more thereof.

The component (C2) may be, for example, a salt compound that has an anion containing boron as a constituent element, that is, $BF_4^-$ or $BR_4^-$ (R represents a phenyl group substituted with two or more fluorine atoms or two or more trifluoromethyl groups), from the viewpoint of storage stability. The anion containing boron as a constituent element may be $BR_4^-$, more specifically, tetrakis(pentafluorophenyl) borate.

The onium salt as the component (C2) may be, for example, an anilinium salt since it has resistance to a substance that may cause curing inhibition with respect to cationic curing. Examples of the anilinium salt compound include N,N-dialkylanilinium salts such as an N,N-dimethylanilinium salt and an N,N-diethylanilinium salt.

The component (C2) may be an anilinium salt that has an anion containing boron as a constituent element. Examples of commercially available products of such a salt compound include CXC-1821 (trade name, manufactured by King Industries, Inc.).

The content of the component (C2) may be, for example, 0.1 to 20 parts by mass, 1 to 18 parts by mass, 3 to 15 parts by mass, or 5 to 12 parts by mass, with respect to 100 parts by mass of the component (C1), from the viewpoint of securing the formability and curability of the adhesive film for forming the first adhesive layer.

The content of the component (C) may be 5% by mass or more, 10% by mass or more, 15% by mass or more, or 20% by mass or more, on the basis of the total mass of the first adhesive layer, from the viewpoint of securing the curability of the adhesive film for forming the first adhesive layer. The content of the component (C) may be 70% by mass or less, 60% by mass or less, 50% by mass or less, or 40% by mass or less, on the basis of the total mass of the first adhesive layer, from the viewpoint of securing the formability of the adhesive film for forming the first adhesive layer. When the content of the component (C) is in the above range, the effect of the present disclosure tends to be significantly exhibited. Note that, the content of the component (C) in the composition or the composition layer (on the basis of the total mass of the composition or the composition layer) may be the same as the above range.

[Other Components]

The first adhesive layer 1 may further contain other components other than the component (A), the cured product of the component (B), and the component (C). Examples of the other components include a thermoplastic resin (hereinafter, referred to as "component (D)" in some cases), a coupling agent (hereinafter, referred to as "component (E)" in some cases), and a filler (hereinafter, referred to as "component (F)" in some cases).

Examples of the component (D) include a phenoxy resin, a polyester resin, a polyamide resin, a polyurethane resin, a polyester urethane resin, acrylic rubber, and an epoxy resin (solid form at 25° C.). These may be used singly or may be used in combination of two or more thereof. When the composition containing the component (A), the component (B), and the component (C) further contains the component (D), a composition layer (and further the first adhesive layer 1) can be easily formed from the composition. Among these, the component (D) may be, for example, a phenoxy resin. The content of the component (D) may be 1% by mass or more, 5% by mass or more, or 10% by mass or more, and may be 70% by mass or less, 50% by mass or less, or 30% by mass or less, on the basis of the total mass of the first adhesive layer. Note that, the content of the component (D) in the composition or the composition layer (on the basis of the total mass of the composition or the composition layer) may be the same as the above range.

Examples of the component (E) include a silane coupling agent having an organic functional group such as a (meth) acryloyl group, a mercapto group, an amino group, an imidazole group, or an epoxy group, a silane compound such as tetraalkoxysilane, a tetraalkoxy titanate derivative, and a polydialkyl titanate derivative. These may be used singly or may be used in combination of two or more thereof. When the first adhesive layer 1 contains the component (E), adhesiveness can be further improved. The component (E) may be, for example, a silane coupling agent. The content of the component (E) may be 0.1 to 10% by mass on the basis of the total mass of the first adhesive layer. Note that, the content of the component (E) in the composition or the composition layer (on the basis of the total mass of the composition or the composition layer) may be the same as the above range.

Examples of the component (F) include non-conductive fillers (for example, non-conductive particles). The component (F) may be, for example, any of an inorganic filler and an organic filler. Examples of the inorganic filler include metallic oxide fine particles such as silica fine particles, alumina fine particles, silica-alumina fine particles, titania fine particles, and zirconia fine particles; and inorganic fine particles such as metallic nitride fine particles. Examples of the organic filler include organic fine particles such as silicone fine particles, methacrylate-butadiene-styrene fine particles, acryl-silicone fine particles, polyamide fine particles, and polyimide fine particles. These may be used singly or may be used in combination of two or more thereof. The component (F) may be, for example, silica fine particles. The content of the component (F) may be 0.1 to 10% by mass on the basis of the total mass of the first adhesive layer. Note that, the content of the component (F) in the composition or the composition layer (on the basis of the total mass of the composition or the composition layer) may be the same as the above range.

[Other Additives]

The first adhesive layer 1 may further contain other additives such as a softener, a promotor, a deterioration inhibitor, a coloring agent, a flame-retardant agent, and a thixotropic agent. The content of the other additives may be, for example, 0.1 to 10% by mass on the basis of the total mass of the first adhesive layer. Note that, the content of the other additives in the composition or the composition layer (on the basis of the total mass of the composition or the composition layer) may be the same as the above range.

A thickness d1 of the first adhesive layer 1 is 5 μm or less, and may be, for example, 4.5 μm or less, 4.0 μm or less, 3.5 μm or less, 3.0 μm or less, or 2.5 μm or less. When the thickness d1 of the first adhesive layer 1 is 5 μm or less, the fluidity of the conductive particles at the time of circuit connection can be further suppressed. Therefore, the capture rate of the conductive particles between electrodes facing each other of a circuit connection structure can be improved, and the connection resistance can be reduced even in the case of mounting at a low pressure. The thickness d1 of the first adhesive layer 1 may be, for example, 0.1 μm or more or 0.7 μm or more. Note that, the thickness d1 of the first adhesive layer 1 can be determined, for example, by a method described in Examples. Furthermore, as illustrated in FIG. 1, in a case where a part of the conductive particle 4 is exposed from the surface of the first adhesive layer 1 (for example, projects on the second adhesive layer 2 side), a distance (distance indicated by d1 in FIG. 1) from a surface 2*a* in the first adhesive layer 1 on a side opposite to the second adhesive layer 2 side to a boundary S between the first adhesive layer 1 and the second adhesive layer 2 positioned at a separate portion of the conductive particles 4 and 4 adjacent to each other is the thickness of the first adhesive layer 1, and the exposed portion of the conductive particle 4 is not included in the thickness of the first adhesive layer 1. The length of the exposed portion of the conductive particle 4 may be, for example, 0.1 μm or more, and may be 5 μm or less.

<Second Adhesive Layer>

The second adhesive layer 2 contains the component (C). The component (C1) and the component (C2) used in the component (C) (that is, the second thermosetting resin component) in the second adhesive layer 2 are the same as the component (C1) and the component (C2) used in the component (C) (that is, the first thermosetting resin component) in the first adhesive layer 1, and thus detailed description thereof will be omitted here. The second thermosetting resin component may be the same as or different from the first thermosetting resin component.

The content of the component (C) may be 5% by mass or more, 10% by mass or more, 15% by mass or more, or 20% by mass or more, on the basis of the total mass of the second adhesive layer, from the viewpoint of maintaining reliability. The content of the component (C) may be 70% by mass or less, 60% by mass or less, 50% by mass or less, or 40% by mass or less, on the basis of the total mass of the second adhesive layer, from the viewpoint of preventing a resin seepage problem in a reel that is an embodiment of supply configuration.

The second adhesive layer 2 may further contain other components and other additives in the first adhesive layer 1. Preferred embodiments of the other components and the other additives are the same as the preferred embodiments of the first adhesive layer 1.

The content of the component (D) may be 1% by mass or more, 5% by mass or more, or 10% by mass or more, and may be 80% by mass or less, 60% by mass or less, or 40% by mass or less, on the basis of the total mass of the second adhesive layer.

The content of the component (E) may be 0.1 to 10% by mass on the basis of the total mass of the second adhesive layer.

The content of the component (F) may be 1% by mass or more, 10% by mass or more, or 30% by mass or more, and may be 90% by mass or less, 70% by mass or less, or 50% by mass or less, on the basis of the total mass of the second adhesive layer.

The content of the other additives may be, for example, 0.1 to 10% by mass on the basis of the total mass of the second adhesive layer.

A thickness d2 of the second adhesive layer 2 may be appropriately set in accordance with the thickness of an electrode of a circuit member to be attached, and the like. The thickness d2 of the second adhesive layer 2 may be 5 μm or more or 7 μm or more, and may be 15 μm or less or 11 μm or less, from the viewpoint that electrodes can be sealed by sufficiently filling a space between the electrodes and more favorable connection reliability is obtained. Note that, the thickness d2 of the second adhesive layer 2 can be determined, for example, by a method described in Examples. Furthermore, in a case where a part of the conductive particle 4 is exposed from the surface of the first adhesive layer 1 (for example, projects on the second adhesive layer 2 side), a distance (distance indicated by d2 in FIG. 1) from a surface 3*a* in the second adhesive layer 2 on a side opposite to the first adhesive layer 1 side to the boundary S between the first adhesive layer 1 and the second adhesive layer 2 positioned at a separate portion of the conductive particles 4 and 4 adjacent to each other is the thickness of the second adhesive layer 2.

The thickness of the adhesive film 10 (the total thickness of all layers constituting the adhesive film 10, in FIG. 1, the total of thickness d1 of the first adhesive layer 1 and the thickness d2 of the second adhesive layer 2) may be, for example, 5 μm or more or 8 μm or more, and may be 30 μm or less or 20 μm or less.

In the adhesive film 10, the conductive particles 4 are dispersed in the first adhesive layer 1. Therefore, the adhesive film 10 may be an anisotropic conductive adhesive film having anisotropic conductivity. The adhesive film 10 is interposed between a first circuit member having a first electrode and a second circuit member having a second electrode and used for electrically connecting the first electrode and the second electrode to each other by thermocompression bonding the first circuit member and the second circuit member.

According to the adhesive film 10, a decrease in exclusion property of the resin can be suppressed while the fluidity of the conductive particles at the time of circuit connection is suppressed by curing the photocurable resin component. Furthermore, when the thickness of the first adhesive layer is 5 μm or less, the fluidity of the conductive particles at the time of circuit connection can be further suppressed. Therefore, the capture rate of the conductive particles between electrodes facing each other of a circuit connection structure can be improved, and the connection resistance can be reduced even in the case of mounting at a low pressure. Such an adhesive film 10 can be suitably used for COP mounting.

Hereinbefore, the adhesive film of the present embodiment has been described, but the present disclosure is not limited to the above-described embodiment.

The adhesive film may be configured, for example, by two layers of the first adhesive layer and the second adhesive layer, and may be configured by three or more layers including two layers of the first adhesive layer and the second adhesive layer. The adhesive film may further include, for example, a third adhesive layer provided on the first adhesive layer on a side opposite to the second adhesive layer and containing a (third) thermosetting resin component. In the adhesive film, there may be a first region that is a region formed from a first adhesive film (first adhesive layer) and a third region that is a region provided adjacent to the first region and formed from a third adhesive film (third adhesive layer). It is also conceivable that the adhesive film further includes the third region provided adjacent to the first region on a side opposite to the second region and containing a (third) thermosetting resin component.

The third adhesive layer contains the component (C). The component (C1) and the component (C2) used in the component (C) (that is, the third thermosetting resin component) in the third adhesive layer are the same as the component (C1) and the component (C2) used in the component (C) (that is, the first thermosetting resin component) in the first adhesive layer 1, and thus detailed description thereof will be omitted here. The third thermosetting resin component may be the same as or different from the first thermosetting resin component. The third thermosetting resin component may be the same as or different from the second thermosetting resin component.

The content of the component (C) may be 5% by mass or more, 10% by mass or more, 15% by mass or more, or 20% by mass or more, on the basis of the total mass of the third adhesive layer, from the viewpoint of imparting favorable transferability and peeling resistance. The content of the component (C) may be 70% by mass or less, 60% by mass or less, 50% by mass or less, or 40% by mass or less, on the basis of the total mass of the third adhesive layer, from the viewpoint of imparting favorable half-cutting property and blocking resistance (resin seepage suppression of a reel).

The third adhesive layer may further contain other components and other additives in the first adhesive layer 1. Preferred embodiments of the other components and the other additives are the same as the preferred embodiments of the first adhesive layer 1.

The content of the component (D) may be 10% by mass or more, 20% by mass or more, or 30% by mass or more, and may be 80% by mass or less, 70% by mass or less, or 60% by mass or less, on the basis of the total mass of the third adhesive layer.

The content of the component (E) may be 0.1 to 10% by mass on the basis of the total mass of the third adhesive layer.

The content of the component (F) may be 1% by mass or more, 3% by mass or more, or 5% by mass or more, and may be 50% by mass or less, 40% by mass or less, or 30% by mass or less, on the basis of the total mass of the third adhesive layer.

The content of the other additives may be, for example, 0.1 to 10% by mass on the basis of the total mass of the third adhesive layer.

The thickness of the third adhesive layer may be appropriately set in accordance with the thickness of an electrode of a circuit member to be attached, and the like. The thickness of the third adhesive layer may be 0.2 μm or more and may be 3.0 μm or less, from the viewpoint that electrodes can be sealed by sufficiently filling a space between the electrodes and more favorable connection reliability is obtained. Note that, the thickness of the third adhesive layer can be determined, for example, by a method described in Examples.

Furthermore, the adhesive film for circuit connection of the embodiment described above is an anisotropic conductive adhesive film having anisotropic conductivity, but the adhesive film for circuit connection may be a conductive adhesive film not having anisotropic conductivity.

<Method for Producing Adhesive Film for Circuit Connection>

A method for producing an adhesive film for circuit connection of an embodiment may include, for example, irradiating a composition layer composed of a composition containing the component (A), component (B), and the component (C) (first thermosetting resin component) with light to form a first adhesive layer (first step) and laminating a second adhesive layer containing the component (C) (second thermosetting resin component) on the first adhesive layer (second step). The first step may be forming a first adhesive layer having a thickness of 5 μm or less. This producing method may further include laminating a third adhesive layer containing the component (C) (third thermosetting resin component) on a layer of the first adhesive layer on a side opposite to the second adhesive layer (third step).

In the first step, for example, first, a composition containing the component (A), component (B), the component (C), and other components and other additives that are added as necessary is dissolved or dispersed by mixing under stirring, kneading, or the like in an organic solvent to prepare a varnish composition. Thereafter, the varnish composition is applied onto a release-treated base material by using a knife coater, a roll coater, an applicator, a comma coater, a die coater, or the like, and the organic solvent is volatilized by heating, thereby forming a composition layer composed of the composition on the base material. At this time, by adjusting the coating amount of the varnish composition, the thickness of the first adhesive layer (first adhesive film) to be finally obtained can be adjusted. Subsequently, the composition layer composed of the composition is irradiated with light to cure the component (B) in the composition layer, thereby forming the first adhesive layer on the base material. The first adhesive layer can be said to be the first adhesive film.

The organic solvent used in preparation of the varnish composition is not particularly limited as long as it has a property in which respective components can be uniformly dissolved or dispersed. Examples of such an organic solvent include toluene, acetone, methyl ethyl ketone, methyl isobutyl ketone, ethyl acetate, propyl acetate, and butyl acetate. These organic solvents can be used singly or in combinations of two or more kinds thereof. Mixing under stirring or kneading at the time of preparation of the varnish composition can be performed, for example, by using a stirrer, a mortar machine, a triple roll mill, a ball mill, a bead mill, a homo-disper, or the like.

The base material is not particularly limited as long as it has heat resistance to endure heating conditions when the organic solvent is volatilized. As such a base material, for example, base materials (for example, films) composed of oriented polypropylene (OPP), polyethylene terephthalate (PET), polyethylene naphthalate, polyethylene isophthalate, polybutylene telephthalate, polyolefin, polyacetate, polycarbonate, polyphenylene sulfide, polyamide, polyimide, cellulose, an ethylene-vinyl acetate copolymer, polyvinyl chloride, polyvinylidene chloride, a synthetic rubber system, a liquid crystal polymer, and the like can be used.

The heating conditions when the organic solvent is volatilized from the varnish composition applied to the base material can be appropriately set in accordance with the organic solvent to be used, and the like. The heating conditions may be, for example, 40 to 120° C. and 0.1 to 10 minutes.

In the light irradiation in a curing step, irradiation light including a wavelength within a range of 150 to 750 nm (for example, ultraviolet light) is preferably used. The irradiation of light can be performed, for example, by using a low-pressure mercury lamp, a medium-pressure mercury lamp, a high-pressure mercury lamp, a super high-pressure mercury lamp, a xenon lamp, a metal halide lamp, an LED light source, or the like. The integrated quantity of light of light irradiation can be appropriately set, but may be, for example, 500 to 3000 mJ/cm$^2$.

The second step is laminating a second adhesive layer on the first adhesive layer. In the second step, for example, first, a second adhesive layer is formed on the base material in the same manner as in the first step, except that the component (C) and other components and other additives that are added as necessary are used and light irradiation is not performed, and a second adhesive film is obtained. Next, the second adhesive layer can be laminated on the first adhesive layer by bonding the first adhesive film and the second adhesive film to each other. Furthermore, in the second step, for example, a second adhesive layer can also be laminated on the first adhesive layer by applying a varnish composition, which is obtained using the component (C) and other components and other additives that are added as necessary, onto the first adhesive layer and volatilizing the organic solvent.

Examples of the method of bonding the first adhesive film and the second adhesive film to each other include methods such as heat press, roll lamination, and vacuum lamination. The lamination can be performed, for example, under a temperature condition of 0 to 80° C.

The third step is laminating a third adhesive layer on a layer of the first adhesive layer on a side opposite to the second adhesive layer. In the third step, for example, first, a third adhesive layer is formed on the base material in the same manner as in the second step, and a third adhesive film is obtained. Next, the third adhesive layer can be laminated on a layer of the first adhesive layer on a side opposite to the second adhesive layer by bonding the third adhesive film to the first adhesive film on a side opposite to the second adhesive film. Furthermore, in the third step, for example, in the same manner as in the second step, the second adhesive layer can also be laminated on the first adhesive layer by applying a varnish composition onto a layer of the first adhesive layer on a side opposite to the second adhesive layer and volatilizing the organic solvent. The bonding method and conditions thereof are the same as those in the second step.

<Circuit Connection Structure and Manufacturing Method Therefor>

Hereinafter, a circuit connection structure and a manufacturing method therefor that use the above-described adhesive film for circuit connection 10 as a circuit connection material will be described.

Figure 2:
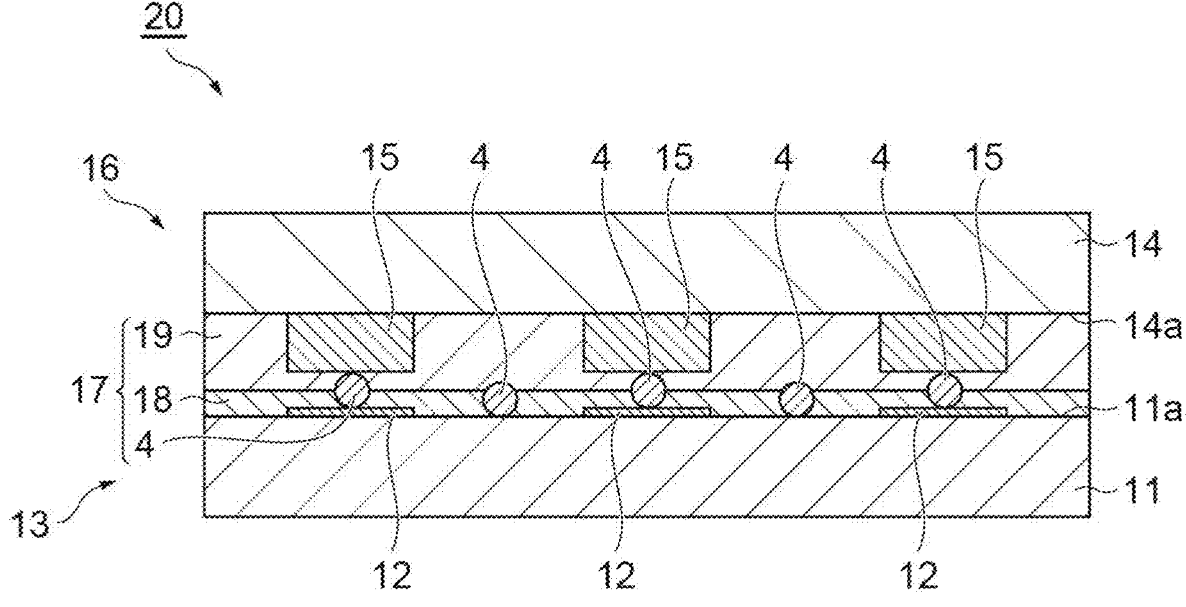
FIG. 2 is a schematic cross-sectional view illustrating an embodiment of a circuit connection structure.

FIG. 2 is a schematic cross-sectional view illustrating an embodiment of a circuit connection structure. As illustrated in FIG. 2, a circuit connection structure 20 includes a first circuit member 13 having a first circuit board 11 and a first electrode 12 formed on a main surface 11*a* of the first circuit board 11, a second circuit member 16 having a second circuit board 14 and a second electrode 15 formed on a main surface 14*a* of the second circuit board 14, and a circuit connection portion 17 disposed between the first circuit board 13 and the second circuit board 16 and electrically connecting the first electrode 12 and the second electrode 15 to each other.

The first circuit member 13 and the second circuit member 16 may be the same as or different from each other. The first circuit member 13 and the second circuit member 16 may be a glass substrate or plastic substrate having an electrode formed thereon, a printed wiring board, a ceramic wiring board, a flexible wiring board, an IC chip, or the like. The first circuit board 11 and the second circuit board 14 may be formed using an inorganic material such as a semiconductor, glass, or ceramic, an organic material such as polyimide or polycarbonate, a composite material such as glass/epoxy, or the like. Among these, since the adhesive film for circuit connection 10 described above can be suitably used for COP mounting, the first circuit member 13 may be, for example, a plastic substrate composed of an organic material such as polyimide, polycarbonate, polyethylene terephthalate, or a cycloolefin polymer, and the second circuit board 14 may be, for example, an IC chip.

The first electrode 12 and the second electrode 15 may be electrodes including metals such as gold, silver, tin, ruthenium, rhodium, palladium, osmium, iridium, platinum, copper, aluminum, molybdenum, and titanium, oxides such as indium tin oxide (ITO), indium zinc oxide (IZO), and indium gallium zinc oxide (IGZO), and the like. The first electrode 12 and the second electrode 15 may be electrodes obtained by laminating two or more kinds of these metals, oxides, and the like. The electrode obtained by laminating two or more kinds thereof may have two or more layers, and may have three or more layers. In a case where the first circuit member 13 is a plastic substrate, the first electrode 12 may be an electrode having a titanium layer on the outermost surface thereof. The first electrode 12 and the second electrode 15 may be circuit electrodes, and may be bump electrodes. At least one of the first electrode 12 and the second electrode 15 may be a bump electrode. FIG. 2 illustrates an embodiment in which the first electrode 12 is a circuit electrode and the second electrode 15 is a bump electrode.

The circuit connection portion 17 includes a cured product of the above-described adhesive film 10. The circuit connection portion 17 may be composed of a cured product of the above-described adhesive film 10. The circuit connection portion 17 has, for example, a first cured product region 18 positioned on the first circuit member 13 side in a direction in which the first circuit member 13 and the second circuit member 16 face each other (hereinafter, referred to as "facing direction") and composed of a cured product of the component (B) and a cured product of the component (C) or the like other than the conductive particles 4 in the above-described first adhesive layer, a second cured product region 19 positioned on the second circuit member 16 side in the facing direction and composed of a cured product of the component (C) or the like in the above-described second adhesive layer, and the conductive particles 4 interposed between at least the first electrode 12 and the second electrode 15 and electrically connecting the first electrode 12 and the second electrode 15 to each other. As illustrated in FIG. 2, the circuit connection portion 17 may not have two clear regions between the first cured product region 18 and the second cured product region 19, and a cured product derived from the first adhesive layer and a cured product derived from the second adhesive layer may be mixed to form one cured product region.

Figure 3:
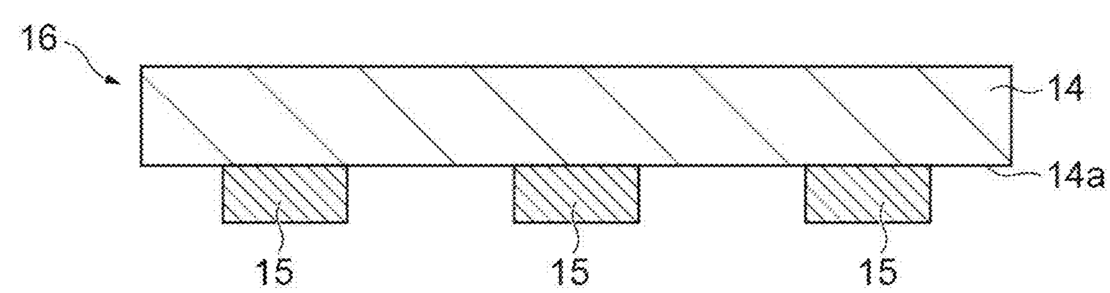
FIG. 3 is a schematic cross-sectional view illustrating an embodiment of a method for manufacturing a circuit connection structure.
Figure 3:
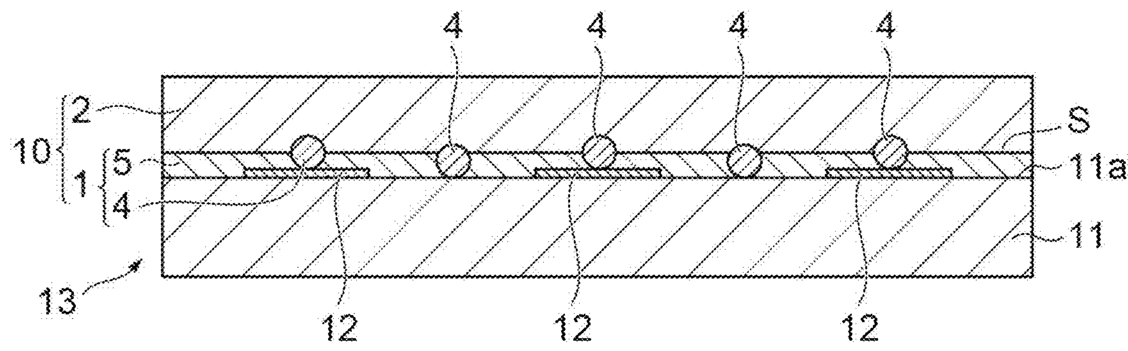
Figure 3:
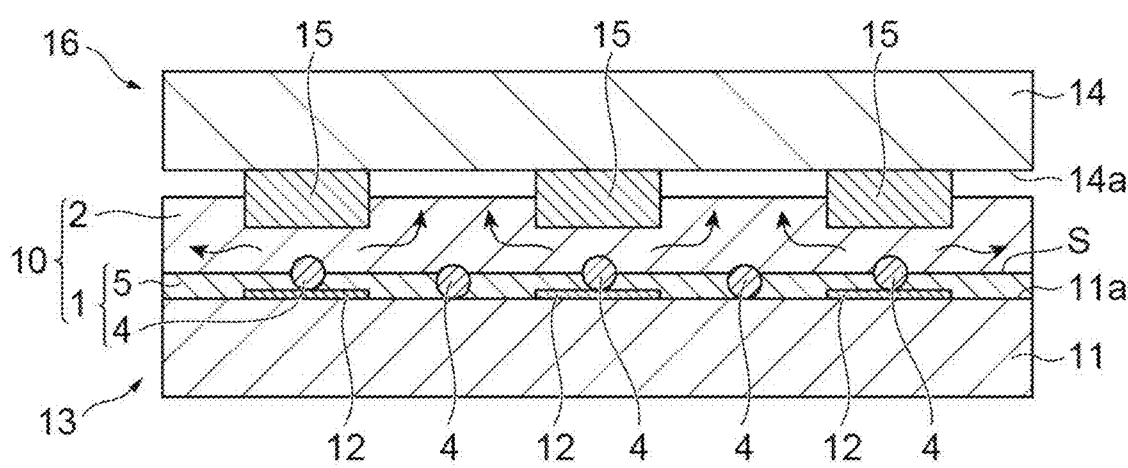

FIG. 3 is a schematic cross-sectional view illustrating an embodiment of a method for manufacturing a circuit connection structure. FIG. 3(*a*) and FIG. 3(*b*) are schematic cross-sectional views illustrating respective steps. As illustrated in FIG. 3, the method for manufacturing the circuit connection structure 20 includes interposing the above-described adhesive film 10 between the first circuit member 13 having the first electrode 12 and the second circuit member 16 having the second electrode 15 and thermocompression bonding the first circuit member 13 and the second circuit member 16 to electrically connect the first electrode 12 and the second electrode 15 to each other.

Specifically, as illustrated in FIG. 3(*a*), first, the first circuit member 13 including the first circuit board 11 and the first electrode 12 formed on the main surface 11*a* of the first circuit board 11 and the second circuit member 16 including the second circuit board 14 and the second electrode 15 formed on the main surface 14*a* of the second circuit board 14 are prepared.

Next, the first circuit member 13 and the second circuit member 16 are disposed such that the first electrode 12 and the second electrode 15 face each other, and the adhesive film 10 is disposed between the first circuit member 13 and the second circuit member 16. For example, as illustrated in FIG. 3(*a*), the adhesive film 10 is laminated on the first circuit member 13 such that the first adhesive layer 1 side faces the main surface 11*a* of the first circuit board 11. Next, the second circuit member 16 is disposed on the first circuit member 13 on which the adhesive film 10 is laminated, such that the first electrode 12 on the first circuit board 11 and the second electrode 15 on the second circuit board 14 face each other.

Then, as illustrated in FIG. 3(*b*), while the first circuit member 13, the adhesive film 10, and the second circuit member 16 are heated, the first circuit member 13 and the second circuit member 16 are pressurized in a thickness direction, thereby thermocompression bonding the first circuit member 13 and the second circuit member 16 to each other. At this time, as shown by the arrows in FIG. 3(*b*), the second adhesive layer 2 has an uncured thermosetting component that can flow, and thus the second adhesive layer 2 flows so as to fill in voids between the second electrodes 15 and is cured by heating described above. Thereby, the first electrode 12 and the second electrode 15 are electrically connected to each other via the conductive particles 4, and the first circuit member 13 and the second circuit member 16 are bonded to each other, so that the circuit connection structure 20 illustrated in FIG. 2 can be obtained. In the method for manufacturing the circuit connection structure 20 of the present embodiment, since it can be said that the first adhesive layer 1 is a layer which is partially cured by light irradiation, the conductive particles 4 are immobilized in the first adhesive layer 1, and since the first adhesive layer 1 does not almost flow at the time of the thermocompression bonding and the conductive particles are efficiently captured between electrodes facing each other, the connection resistance between the first electrode 12 and the second electrode 15 facing each other is reduced. Furthermore, when the thickness of the first adhesive layer is 5 μm or less, the fluidity of the conductive particles at the time of circuit connection can be further suppressed.

The heating temperature in the case of thermocompression bonding can be appropriately set, but may be, for example, 50 to 190° C. The pressure to be applied is not particularly limited as long as it does not damage an adherend, but may be, for example, a pressure of 0.1 to 50 MPa in terms of area in the bump electrode in the case of COP mounting. Furthermore, in the case of COG mounting, the pressure to be applied may be, for example, a pressure of 10 to 100 MPa in terms of area in the bump electrode. The time for these heating and pressurizing may be in a range of 0.5 to 120 seconds.

EXAMPLES

Hereinafter, the present disclosure will be more specifically described by means of Examples. However, the present disclosure is not limited to these Examples.

[Production of First Adhesive Layer, Second Adhesive Layer, and Third Adhesive Layer]

In production of the first adhesive layer, the second adhesive layer, and the third adhesive layer, materials described below were used.

Component (A): Conductive Particles

- Conductive particles A-1: Using conductive particles having an average particle diameter of 3.2 μm obtained by subjecting the surface of a plastic core to Ni plating and subjecting the outermost surface to displacement plating with Pd Component (B): Photocurable Resin Component A combination of the (B1) radical polymerizable compound and the (B2) photo radical polymerization initiator can act as a photocurable resin component (that is, the component (B)). On the other hand, a combination of the (B1) radical polymerizable compound and a (b2) thermal radical polymerization initiator can act as a thermosetting component.

Component (B1): Radical Polymerizable Compound

- Radical polymerizable compound B1-1: NK ESTETR A-BPEF (ethoxylated fluorene type di(meth)acrylate (bifunctional), manufactured by SHIN-NAKAMURA CHEMICAL Co., Ltd.), using one diluted with an organic solvent to have a non-volatile content of 70% by mass
- Radical polymerizable compound B1-2: Ripoxy VR-90 (bisphenol A type epoxy (meth)acrylate (bifunctional) (vinyl ester resin), manufactured by Showa Denko K.K.), using one having a non-volatile content of 100% by mass
- Radical polymerizable compound B1-3: CYCLOMER M100 (methacrylate having an alicyclic epoxy group (monofunctional), manufactured by Daicel Corporation), using one having a non-volatile content of 100% by mass Component (B2): Photo Radical Polymerization Initiator Photo radical polymerization initiator B2-1: Irgacure OXE-02 (compound having an oxime ester structure, manufactured by BASF), using one diluted with an organic solvent to have a non-volatile content of 10% by mass Component (b2): Thermal Radical Polymerization Initiator Thermal radical polymerization initiator b2-1: PERCUMYL D (dialkyl peroxide, manufactured by NOF CORPORATION), using one diluted with an organic solvent to have a non-volatile content of 20% by mass Component (C): Thermosetting Resin Component A combination of the (C1) cationic polymerizable compound and the (C2) thermal cationic polymerization initiator can act as a thermosetting component (that is, the component (C)). On the other hand, a combination of the (C1) cationic polymerizable compound and a (c2) photo cationic polymerization initiator (b2) can act as a photocurable component.

Component (C1): Cationic Polymerizable Compound

Cationic polymerizable compound C1-1: ETERNACOLL OXBP (oxetane compound, manufactured by UBE Corporation), using one having a non-volatile content of 100% by mass Cationic polymerizable compound C1-2: OXSQ (oxetane compound, manufactured by TOAGOSEI CO., LTD.), using one having a non-volatile content of 100% by mass Cationic polymerizable compound C1-3: EHPE3150 (alicyclic epoxy compound, manufactured by Daicel Corporation), using one diluted with an organic solvent to have a non-volatile content of 70% by mass Cationic polymerizable compound C1-4: CELLOXIDE 8010 (alicyclic epoxy compound, manufactured by Daicel Corporation), using one having a non-volatile content of 100% by mass Cationic polymerizable compound C1-5: CELLOXIDE 2021P (alicyclic epoxy compound, manufactured by Daicel Corporation), using one having a non-volatile content of 100% by mass Cationic polymerizable compound C1-6: Mixture obtained by kneading butadiene rubber fine particles having a primary particle diameter of less than 1 μm with cationic polymerizable compound C1-5 at a ratio of 3:1 (cationic polymerizable compound:butadiene rubber fine particles), using one having a non-volatile content of 100% by mass Component (C2): Thermal Cationic Polymerization Initiator Thermal cationic polymerization initiator C2-1: CXC-1821 (N-(p-methoxybenzyl)-N,N-dimethylanilinium tetrakis(pentafluorophenyl)borate, manufactured by King Industries, Inc.), using one having a non-volatile content of 100% by mass Component (c2): Photo Cationic Polymerization Initiator Photo cationic polymerization initiator c2-1: CPI-310B (manufactured by San-Apro Ltd.), using one diluted with an organic solvent to have a non-volatile content of 10% by mass Component (D): Thermoplastic Resin Thermoplastic resin D-1: Phenotohto FX-293 (phenoxy resin, manufactured by NIPPON STEEL Chemical & Material CO., LTD.), using one diluted with an organic solvent to have a non-volatile content of 40% by mass Thermoplastic resin D-2: Phenotohto YP-50S (phenoxy resin, manufactured by NIPPON STEEL Chemical & Material CO., LTD.), using one diluted with an organic solvent to have a non-volatile content of 40% by mass Thermoplastic resin D-3: TOPR-300 (phenoxy resin, manufactured by NIPPON STEEL Chemical & Material CO., LTD.), using one diluted with an organic solvent to have a non-volatile content of 60% by mass Thermoplastic resin D-4: jER1007 (epoxy resin, manufactured by Mitsubishi Chemical Corporation), using one diluted with an organic solvent to have a non-volatile content of 70% by mass Thermoplastic resin D-5: Phenotohto ZX-1356-2 (phenoxy resin, manufactured by NIPPON STEEL Chemical & Material CO., LTD.), using one diluted with an organic solvent to have a non-volatile content of 40% by mass Component (E): Coupling Agent Coupling agent E-1: SH-6040 (3-glycidoxypropyltrimethoxysilane, manufactured by Toray-Dow Corning Co., Ltd.), using one having a non-volatile content of 100% by mass Component (F): Filler Filler F-1: ADMANANO YA050-MJL (silica fine particles, manufactured by ADMATECHS COMPANY LIMITED), using one diluted with an organic solvent to have a non-volatile content of 50% by mass Filler F-2: AEROSIL R805 (silica fine particles, manufactured by Evonik Industries AG), using one diluted with an organic solvent to have a non-volatile content of 10% by mass Filler F-3: ADMAFINE SE2050 (silica fine particles, manufactured by ADMATECHS COMPANY LIMITED), using one diluted with an organic solvent to have a non-volatile content of 70% by mass <Production of First Adhesive Film (First Adhesive Layer)>

After materials shown in Table 1 were mixed at composition ratios shown in Table 1 (numerical values in Table 1 mean non-volatile content amounts) to obtain a composition, the composition was applied onto a release-treated PET (polyethylene terephthalate) film while applying a magnetic field, and the organic solvent and the like were dried at 70° C. for 5 minutes with hot air, thereby obtaining composition layers 1a to 1i composed of the composition containing the respective components. The composition was applied so that the thicknesses of the composition layers 1a to 1i after drying finally reached the thicknesses shown in Table 4 and Table 5. Next, as for the composition layers 1a to 1f, each of the layers was irradiated with light (UV irradiation: metal halide lamp, integrated quantity of light: 1900 to 2300 mJ/cm$^2$) to obtain first adhesive films 1A to 1F. As for the composition layer 1g, the layer was irradiated with light (UV irradiation: metal halide lamp, integrated quantity of light: 1000 to 1500 mJ/cm$^2$) to obtain a first adhesive film 1G. On the other hand, the composition layers 1h and 1i were not treated and was used directly as first adhesive films 1H and 1I.

TABLE 1

| | | | Composition layer | | | | | | | | |
|---|---|---|---|---|---|---|---|---|---|---|---|
| | | | 1a | 1b | 1c | 1d | 1e | 1f | 1g | 1h | 1i |
| (A) | A-1 | | 45 | 45 | 45 | 45 | 45 | 45 | 45 | 60 | 45 |
| (B) | (Bl) | Bl-1 | 30 | 20 | 20 | 10 | 20 | 20 | — | — | 20 |
| | | Bl-2 | — | — | 10 | 10 | 10 | 10 | — | — | 10 |

TABLE 1-continued

| | | | | | | | | | | | |
|---|---|---|---|---|---|---|---|---|---|---|---|
| | | Bl-3 | — | 10 | — | — | — | — | — | — | — |
| | (B2) | B2-1 | 0.5 | 0.5 | 0.5 | 0.5 | 0.5 | 0.5 | — | — | — |
| | (b2) | b2-l | — | — | — | — | — | — | — | — | 5 |
| (C) | (Cl) | Cl-1 | 25 | 25 | 25 | 30 | 25 | 25 | 20 | 30 | 25 |
| | | Cl-2 | 5 | 5 | 5 | 5 | 5 | 5 | 20 | — | 5 |
| | | Cl-3 | 10 | 10 | 10 | 10 | 10 | 10 | — | — | 10 |
| | | Cl-4 | — | — | — | — | — | — | — | 15 | — |
| | (C2) | C2-1 | 4 | 4 | 4 | 4 | 4 | 4 | — | 4 | 4 |
| | (c2) | c2-l | — | — | — | — | — | — | 0.5 | — | — |
| (D) | D-1 | | 30 | 30 | 30 | 35 | 30 | 30 | 60 | 30 | 30 |
| (E) | E-1 | | 3 | 3 | 3 | 3 | 3 | 3 | 3 | — | 3 |
| (F) | F-1 | | — | — | — | — | — | — | — | 20 | — |
| | F-2 | | — | — | — | — | — | — | — | 7 | — |

| | First adhesive film | | | | | | | | |
|---|---|---|---|---|---|---|---|---|---|
| | 1A | 1B | 1C | 1D | 1E | 1F | 1G | 1H | 1I |
| Type of composition layer | 1a | 1b | 1c | 1d | 1e | 1f | 1g | 1h | 1i |
| Presence/Absence of light irradiation | Present | Present | Present | Present | Present | Present | Present | Absent | Absent |

<Production of Second Adhesive Film (Second Adhesive Layer)>

After materials shown in Table 2 were mixed at composition ratios shown in Table 2 (numerical values in Table 2 mean non-volatile content amounts), the resultant mixture was applied onto a release-treated PET (polyethylene terephthalate) film, and the organic solvent and the like were dried, thereby obtaining second adhesive films 2A to 2C containing the respective components. The mixture was applied so that the thickness of the second adhesive film 2A after drying reached 9 μm, the thickness of the second adhesive film 2B after drying reached 10 μm, and the thickness of the second adhesive film 2C after drying reached 7 μm.

TABLE 2

| | | | Second adhesive film (second adhesive layer) | | |
|---|---|---|---|---|---|
| | | | 2A | 2B | 2C |
| (C) | (C1) | C1-1 | 20 | 20 | 14 |
| | | C1-3 | 10 | 10 | — |
| | | C1-5 | 20 | 20 | — |
| | | C1-6 | — | — | 30 |
| | (C2) | C2-1 | 4 | 4 | 5 |
| (D) | D-2 | | 18 | 18 | 10 |
| | D-3 | | 40 | 40 | — |
| | D-4 | | — | — | 30 |
| (E) | E-1 | | 5 | 5 | 5 |
| (F) | F-1 | | — | — | 43 |
| | F-2 | | 5 | 5 | — |
| | F-3 | | 80 | 80 | — |

<Production of Third Adhesive Film (Third Adhesive Layer)>

After materials shown in Table 3 were mixed at composition ratios shown in Table 3 (numerical values in Table 3 mean non-volatile content amounts), the resultant mixture was applied onto a release-treated PET (polyethylene terephthalate) film, and the organic solvent and the like were dried, thereby obtaining a third adhesive film 3A. Note that, the mixture was applied so that the thickness of the third adhesive film 3A after drying reached 1 μm.

TABLE 3

| | | | Third adhesive film (third adhesive layer) 3A |
|---|---|---|---|
| (C) | (C1) | C1-5 | 40 |
| | (C2) | C2-1 | 4 |
| (D) | D-1 | | 30 |
| | D-5 | | 30 |
| (E) | E-1 | | 3 |
| (F) | F-2 | | 15 |

Examples 1 to 8 and Comparative Examples 1 to 5

[Production of Adhesive Film]

Adhesive films having configurations shown in Table 4 and Table 5 were produced using the first adhesive film, the second adhesive film, and the third adhesive film produced above. For example, in the adhesive film of Example 1, the first adhesive film 1A was bonded to the second adhesive film 2A at a temperature of 50 to 60° C., and the release film of the first adhesive film 1A was peeled off. Next, the third adhesive film 3A was bonded to the first adhesive film 1A exposed by peeling off the release film at a temperature of 50 to 60° C. to obtain an adhesive film of Example 1. As for three-layered adhesive films of Examples 2 to 4 and 7 and Comparative Examples 3 and 5, adhesive films having configurations shown in Table 4 and Table 5 were produced in the same manner as in Example 1. As for two-layered adhesive films of Examples 5, 6, and 8 and Comparative Examples 1, 2, and 4, adhesive films having configurations shown in Table 4 and Table 5 were produced in the same manner as in Example 1, except that the third adhesive film was not bonded.

[Measurement of Thickness of Each Adhesive Layer in Adhesive Film]

As for the adhesive films of Examples 1 to 8 and Comparative Examples 1 to 5, the thicknesses of the first adhesive layer, the second adhesive layer, and the third adhesive layer were measured. In the measurement, the adhesive film was interposed between two sheets of glass (thickness: about 1 mm) and cast with a resin composition composed of 100 g of a bisphenol A type epoxy resin (trade name: JER811, manufactured by Mitsubishi Chemical Corporation) and 10 g of a curing agent (trade name: Epomount Curing Agent, manufactured by Refine Tec Ltd.), the cross section was then polished using a polishing machine, and the thicknesses of the first adhesive layer, the second adhesive layer, and the third adhesive layer were measured using a scanning electron microscope (SEM, trade name: SE-8020, manufactured by Hitachi High-Tech Science Corporation). The results are shown in Table 4 and Table 5.

[Measurement of Conductive Particle Density]

As for the adhesive films of Examples 1 to 8 and Comparative Examples 1 to 5, the number of conductive particles per 25000 μm$^2$ was measured at 20 places using a microscope and image analysis software (trade name: ImagePro, manufactured by Hakuto Co., Ltd.), and an average value thereof was converted into the number of conductive particles per 1 mm$^2$, thereby determining the conductive particle density. The results are shown in Table 4 and Table 5.

[Evaluation of Capture Rate of Conductive Particles and Evaluation of Connection Resistance]

(Preparation of Circuit Member)

As the first circuit member, one obtained by forming a wiring pattern (pattern width: 19 μm, space between electrodes: 5 μm) with Ti (50 nm)/Al (400 nm) on the surface of a polyimide substrate (200H, manufactured by Du Pont-Toray Co., Ltd., outer shape: 38 mm×28 mm, thickness: 0.05 mm) was prepared. As the second circuit member, an IC chip (outer shape: 0.9 mm×20.3 mm, thickness: 0.3 mm, size of bump electrode: 70 μm×12 μm, space between bump electrodes: 12 μm, bump electrode thickness: 9 μm) in which bump electrodes are arranged in two staggered rows was prepared.

(Production of Circuit Connection Structure)

A circuit connection structure was produced using each adhesive film of Examples 1 to 8 and Comparative Examples 1 to 5. The adhesive film was disposed on the first circuit member such that the first adhesive layer or the third adhesive layer of the adhesive film was in contact with the first circuit member. The adhesive film was bonded to the first circuit member by heating and pressurizing for 2 seconds under the conditions of 70° C. and 0.98 MPa (10 kgf/cm$^2$) using a thermocompression bonding apparatus (BS-17U, manufactured by OHASHI ENGINEERING CO., LTD.) configured by a stage including a ceramic heater and a tool (8 mm×50 mm), and the release film of the adhesive film on a side opposite to the first circuit member was peeled off. Next, after the bump electrode of the first circuit member and the circuit electrode of the second circuit member were aligned, the second adhesive layer of the adhesive film was bonded to the second circuit member by heating and pressurizing for 5 seconds under the conditions of a measured maximum reached temperature of the adhesive film of 170° C. and a pressure of 30 MPa in terms of area in the bump electrode, and a circuit connection structure was produced.

[Evaluation of Capture Rate of Conductive Particles]

In the circuit connection structure obtained using each adhesive film of Examples 1 to 8 and Comparative Examples 1 to 5, the capture rate of the conductive particles between the bump electrode and the circuit electrode was evaluated. Here, the capture rate of the conductive particles means a ratio of the density of the conductive particles on the bump electrode with respect to the density of the conductive particles in the adhesive film, and was calculated from a calculation formula described below. Furthermore, the average of the number of the conductive particles on the bump electrode was determined by measuring the number of conductive particles captured per 1 bump through the metal electrode by observation of the mounted circuit member from the polyimide substrate using a differential interference microscope. A case where the capture rate of the conductive particles is 80% or more was determined as "S", a case where the capture rate of the conductive particles is 60% or more was determined as "A", and a case where the capture rate of the conductive particles is less than 60% was determined as "B". The results are shown in Table 4 and Table 5.

Capture rate (%) of conductive particles=(Average of the number of conductive particles on the bump electrode/(Bump electrode area×Density of conductive particles in the adhesive film))×100

(Evaluation of Connection Resistance)

The connection resistance was evaluated using the circuit connection structure obtained using each adhesive film of Examples 1 to 8 and Comparative Examples 1 to 5. The evaluation of the connection resistance was performed by a four-terminal measuring method, and the connection resistance was evaluated using an average value of connection resistance values measured at 14 places. In the measurement, a multimeter (MLR21, manufactured by ETAC (Kusumoto Chemicals, Ltd.)) was used. A case where the connection resistance value is less than 0.6Ω was determined as "S", a case where the connection resistance value is less than 1.0Ω was determined as "A", and a case where the connection resistance value is 1.0Ω or more was determined as "B". The results are shown in Table 4 and Table 5.

TABLE 4

| | | Exam. 1 | Exam. 2 | Exam. 3 | Exam. 4 | Exam. 5 | Exam. 6 | Exam. 7 | Exam. 8 |
|---|---|---|---|---|---|---|---|---|---|
| Second adhesive layer | Type | 2A | 2A | 2A | 2A | 2B | 2B | 2A | 2A |
| | Thickness (μm) | 9 | 9 | 9 | 9 | 10 | 10 | 9 | 9 |
| First adhesive layer | Type | 1A | 1B | 1C | 1D | 1C | 1D | 1C | 1C |
| | Thickness (μm) | 2 | 2 | 2 | 2 | 2 | 2 | 4 | 4 |
| Third adhesive layer | Type | 3A | 3A | 3A | 3A | — | — | 3A | — |
| | Thickness (μm) | 1 | 1 | 1 | 1 | — | — | 1 | — |
| Layer configuration | | Three-layered | Three-layered | Three-layered | Three-layered | Two-layered | Two-layered | Three-layered | Two-layered |
| Conductive particle density (counts/mm$^2$) | | 18000 | 18000 | 18000 | 18000 | 18000 | 18000 | 36000 | 36000 |
| Capture rate of conductive particles | | S | A | A | A | S | S | A | A |
| Connection resistance | | A | A | A | A | S | S | A | A |

TABLE 5

| | | Comp. Exam. 1 | Comp. Exam. 2 | Comp. Exam. 3 | Comp. Exam. 4 | Comp. Exam. 5 |
|---|---|---|---|---|---|---|
| Second adhesive layer | Type | 2B | 2B | 2A | 2C | 2A |
| | Thickness (μm) | 10 | 10 | 9 | 7 | 9 |
| First adhesive layer | Type | 1E | 1F | 1G | 1H | 1I |
| | Thickness (μm) | 6 | 10 | 2 | 6 | 2 |
| Third adhesive layer | Type | — | — | 3A | — | 3A |
| | Thickness (μm) | — | — | 1 | — | — |
| Layer configuration | | Two-layered | Two-layered | Three-layered | Two-layered | Three-layered |
| Conductive particle density (counts/mm$^2$) | | 33000 | 54000 | 18000 | 48000 | 18000 |
| Capture rate of conductive particles | | B | B | A | B | B |
| Connection resistance | | B | B | B | A | A |

As shown in Table 4 and Table 5, the adhesive films of Examples 1 to 8 were excellent in terms of both of the capture rate of the conductive particles and the connection resistance in mounting at a low pressure. On the other hand, the adhesive films of Comparative Examples 1 to 5 were not sufficient in terms of at least one of the capture rate of the conductive particles and the connection resistance. From this point, it was confirmed that the adhesive film of the present disclosure can improve the capture rate of the conductive particles between the electrodes facing each other of the circuit connection structure, and reduce the connection resistance even in the case of mounting at a low pressure.

REFERENCE SIGNS LIST

1: first adhesive layer, 2: second adhesive layer, 4: conductive particles, 5: adhesive component, 10: adhesive film for circuit connection (adhesive film), 11: first circuit board, 12: first electrode (circuit electrode), 13: first circuit member, 14: second circuit board, 15: second electrode (bump electrode), 16: second circuit member, 17: circuit connection portion, 20: circuit connection structure.

The invention claimed is:

1. An adhesive film for circuit connection, comprising:

a first adhesive layer comprising conductive particles, a cured product of a photocurable resin component comprising a radical polymerizable compound and a photo radical polymerization initiator, and a first thermosetting resin component comprising a cationic polymerizable compound and a thermal cationic polymerization initiator; and a second adhesive layer provided on the first adhesive layer and comprising a second thermosetting resin component comprising a cationic polymerizable compound and a thermal cationic polymerization initiator, wherein a thickness of the first adhesive layer is 5 μm or less, the cationic polymerizable compound comprises both an oxetane compound and an alicyclic epoxy compound, and in the first adhesive layer, a content of the cured product of the photocurable resin component is 10% to 30% by mass, and a content of the first thermosetting resin component is 20% to 40% by mass, based on a total mass of the first adhesive layer.

2. The adhesive film for circuit connection according to claim 1, wherein the thermal cationic polymerization initiator is a salt compound that has an anion comprising boron as a constituent element.

3. The adhesive film for circuit connection according to claim 1, further comprising a third adhesive layer provided on the first adhesive layer on a side opposite to the second adhesive layer and comprising a third thermosetting resin component.

4. The adhesive film for circuit connection according to claim 3, wherein the third thermosetting resin component comprises a cationic polymerizable compound and a thermal cationic polymerization initiator.

5. The adhesive film for circuit connection according to claim 1, wherein the radical polymerizable component is a bifunctional aromatic (meth)acrylate.

6. A method for manufacturing a circuit connection structure, the method comprising interposing the adhesive film for circuit connection according to claim 1 between a first circuit member having a first electrode and a second circuit member having a second electrode and thermocompression bonding the first circuit member and the second circuit member to electrically connect the first electrode and the second electrode to each other.

7. A circuit connection structure comprising:

a first circuit member having a first electrode;

a second circuit member having a second electrode; and a circuit connection portion disposed between the first circuit member and the second circuit member and electrically connecting the first electrode and the second electrode to each other, wherein the circuit connection portion comprises a cured product of the adhesive film for circuit connection according to claim 1.

* * * * *